United States Patent [19]

Gutleber

[11] Patent Number: 4,527,276
[45] Date of Patent: Jul. 2, 1985

[54] DIGITAL PULSE POSITION MODULATION COMMUNICATIONS SYSTEM WITH THRESHOLD EXTENSION

[75] Inventor: Frank S. Gutleber, Little Silver, N.J.

[73] Assignee: The United States of America as represented by the Secretary of the Army, Washington, D.C.

[21] Appl. No.: 571,301

[22] Filed: Jan. 16, 1984

[51] Int. Cl.³ ............................................. H03K 9/04
[52] U.S. Cl. ...................................... 375/23; 329/107
[58] Field of Search ................... 332/1, 9 R; 329/104, 329/107; 307/234; 328/109, 111; 375/23; 370/10; 340/825.63, 825.64, 870.2, 870.24

[56] References Cited

U.S. PATENT DOCUMENTS

| | | | |
|---|---|---|---|
| 3,760,422 | 9/1973 | Zimmer et al. | 340/825.64 |
| 4,017,806 | 4/1977 | Rogers | 329/107 |
| 4,095,211 | 6/1978 | Shaughnessy | 375/23 |
| 4,389,616 | 6/1983 | Göckler et al. | 329/107 |

Primary Examiner—Benedict V. Safourek
Attorney, Agent, or Firm—Anthony T. Lane; Michael Zelenka; Jeremiah G. Murray

[57] ABSTRACT

A digital pulse position modulation (PPM) communications system with threshold extension including a radio receiver for achieving optimum coherent detection of a pulse position modulated communication signal including a coherent video detector coupled to the IF output of the radio receiver and a pulse repetition frequency loop locked to the detected video signals containing position modulation. The pulse repetition frequency loop includes a time discriminator, a filter, a voltage controlled oscillator, and a split gate generator providing a split gate no greater than the width of the applied video signal. The split gate is applied to the time discriminator resulting in the detected video signal being multiplied by itself or coherently detected. A low pass filter is connected to the output of the discriminator to provide a demodulated communications analog or quasi-analog output signal such as a voice signal, transmitted to the receiver from a digitally coded PPM communications transmitter.

14 Claims, 4 Drawing Figures

DIGITAL PULSE POSITION MODULATION COMMUNICATIONS SYSTEM WITH THRESHOLD EXTENSION The invention described herein may be manufactured, used and licensed by or for the Government for governmental purposes without the payment of any royalties thereon or therefor.

FIELD OF THE INVENTION

This invention relates generally to digital type communications systems and more particularly to demodulators for digital pulse position modulation communications systems.

BACKGROUND OF THE INVENTION

Digital pulse code communications systems employing video detectors implemented with linear or square law detector circuits are well known; however, at low signal-to-noise ratios, extremely large degradation of the signal-to-noise ratio occurs which operates to distort the communications signal. In voice communications systems, the signal-to-noise degradation would render the demodulated voice unintelligible.

Accordingly, it is an object of the present invention to provide an improvement in the detection of communications signals.

It is a further object of the invention to provide an improvement in the detection of digital pulse coded communications signals.

It is another object of the invention to provide an improvement in the detection of pulse position modulated communications signals having low signal-to-noise ratios.

SUMMARY OF THE INVENTION

Briefly, the foregoing as well as other objects of the present invention are achieved by means of a quadrature type coherent video detector and pulse repetition frequency loop coupled thereto and operating as a coherent signal demodulator for providing an output of a communications signal included in a pulsed IF signal provided by a receiver responsive to pulse position modulated communications signals transmitted from a radio transmitter adapted to transmit pulse position modulated RF signals. The coherent video detector is implemented either by way of a summation type quadrature phase detector or a synchronized phase lock loop while the pulse repetition frequency loop is comprised of a time discriminator coupled to the output of the coherent video detector. The loop is further closed by means of a loop filter, a voltage controlled oscillator and a split gate generator generating and coupling a split gate to the time discriminator of a pulse width no greater than the width of the input detected video pulse. A low pass filter is coupled to the output of the time discriminator to provide an output of the desired communications signal.

BRIEF DESCRIPTION OF THE DRAWING

The invention will become more clearly understood from a consideration of the following detailed description when taken in conjunction with the accompanying drawings in which.

DETAILED DESCRIPTION OF THE INVENTION

Figure 1:
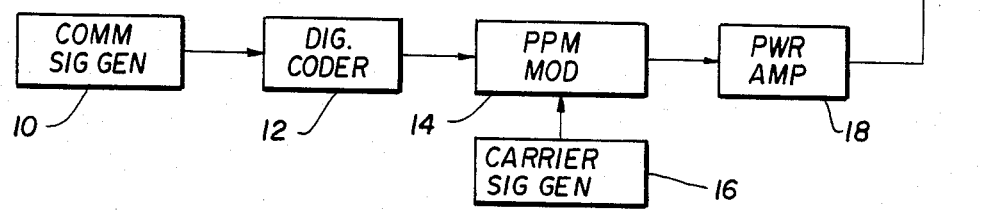
FIG. 1 is a block diagram of the transmitter portion of a digital pulse position modulation communication system.
Figure 2:
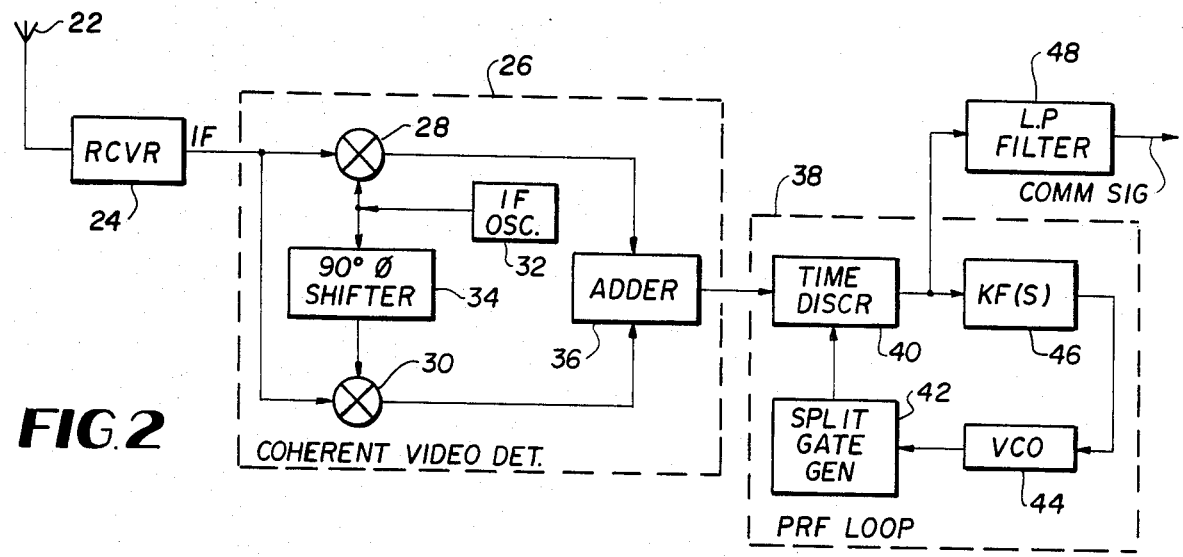
FIG. 2 is a block diagram of the receiver portion of a digital pulse position modulation communication system including a first embodiment of the invention.
Figure 3:
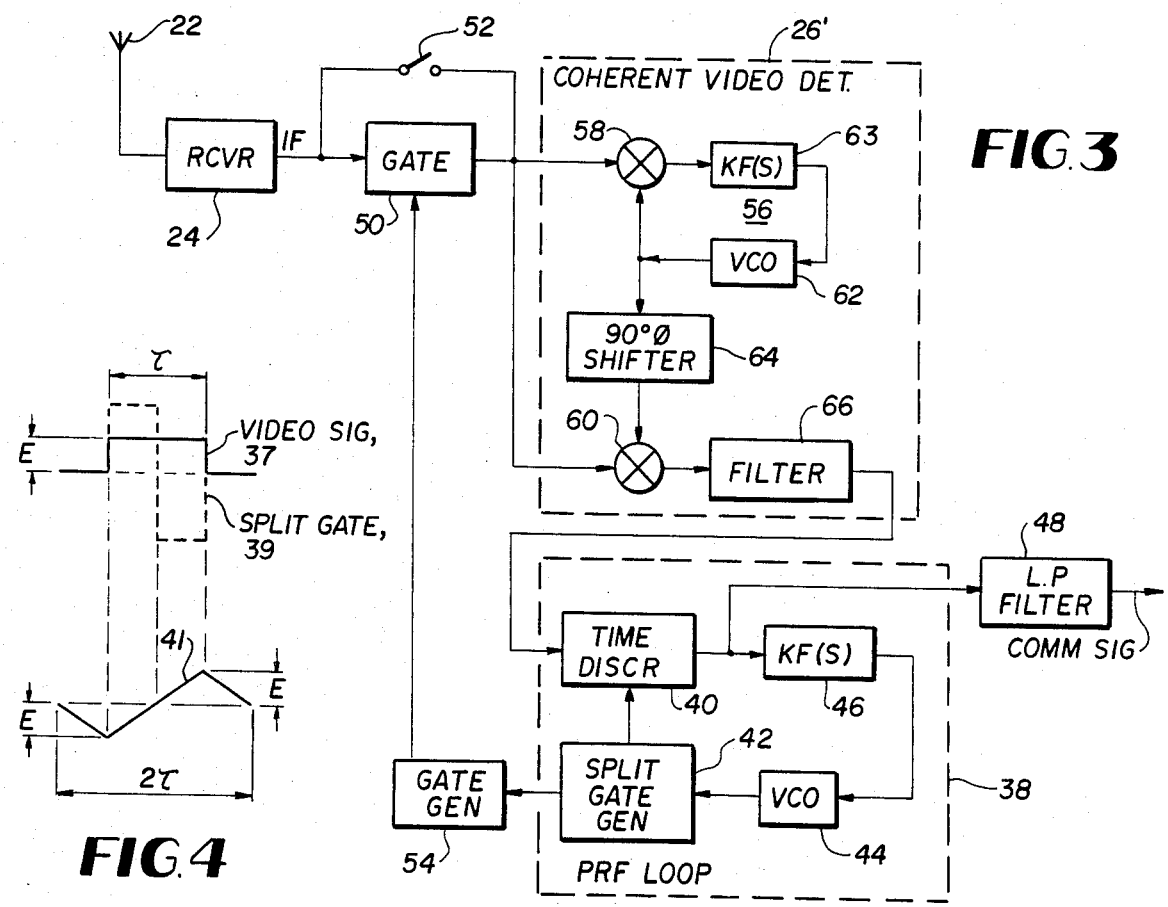
FIG. 3 is a block diagram of the receiver portion of a pulse position modulation communication system including a second embodiment of the invention.

Assuming that the present invention is used in connection with an audio, i.e. voice communication system, FIG. 1 discloses the transmitter of such a system while FIGS. 2 and 3 disclose two versions of a receiver therefor. Considering now FIG. 1, reference numeral 10 denotes a communications signal generator which may be, for example, a microphone coupled to a digital coder 12. The digital coder 12 converts the audio or voice communications signal from the generator 10 into a digital code which is fed to a pulse position code modulator 14. The modulator 14 generates a pulse position modulation signal which is combined with a carrier frequency from a carrier signal generator 16. The resultant signal out of the modulator 14 is amplified by a power amplifier 18 where it is radiated from an antenna 20.

The transmitted signal, as shown in FIGS. 2 and 3, is sensed by an antenna 22 which is then coupled to an RF receiver 24. The receiver includes a mixer and local oscillator means, not shown, which operates in a well known manner to translate the carrier frequency of the transmitted signal and provide a pulse position modulated IF signal. In order to demodulate the audio communications signal and extend the threshold of detection to very low signal to noise ratios, reference now to FIG. 2 discloses a first embodiment of apparatus for accomplishing such a result. As shown in FIG. 2, a coherent video detector 26 comprising a quadraphase detector is implemented by means of two signal multipliers 28 and 30 which respectively have one input directly connected to the IF output signal from the receiver 24. The other input to the multipliers 28 and 30 comprises a sine wave signal at the IF frequency and which is generated by a local IF oscillator 32. The IF oscillator 32 is directly coupled to the first multiplier 28 while it is coupled to the second multiplier 30 through a 90° phase shifter 34. The multipliers 28 and 30 multiply the IF input signal from the receiver 24 with the IF oscillator signal to provide DC outputs during IF pulse presence, i.e. envelope or video detected pulses, since the IF input pulses will be in phase with one of the quadrature sine wave signals from the oscillator 32 or partially with each. Accordingly, the output of the multipliers 28 and 30 are coupled to an adder 36 which provides pulse detected output signals of the pulse position modulation IF input signals applied to the coherent video detector 26. The adder 36 sums the amplitude of the two quadrature detected signals.

Figure 4:
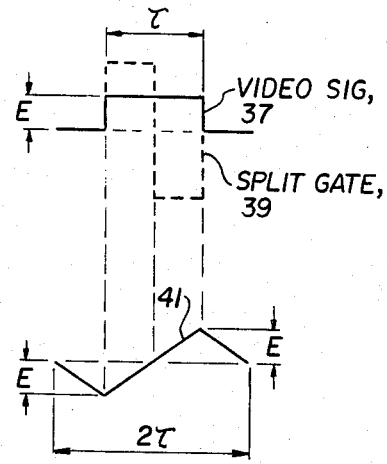
FIG. 4 is a set of time related waveforms helpful in understanding the subject invention.

The summed video output pulses 37 (FIG. 4) from the adder 36 are coupled to a pulse repetition frequency (PRF) loop 38 which locks onto the detected video pulses containing the pulse position modulation. The PRF lock loop 38 is comprised of a time discriminator 40 which is coupled to the detected video signal 37 from the detector 26 along with a split gate 39 which is derived from a split gate generator 42 coupled to a voltage controlled oscillator 44 whose frequency is controlled by the output of the time discriminator 40 which is first filtered by a loop filter 46. It is important to note that the width of the split gate fed to the time discriminator 40 from the generator 42 is no greater than the width of the video pulses fed to the time discriminator. This results in the equivalent of the input video signal being multiplied by itself and accordingly being coherently detected. As the modulation moves the time position of the video pulses from frame to frame, the closed PRF lock loop 38 will control the gate generator 42 so as to keep the split gate centered on the video pulse. Thus the output of the discriminator 40 comprises a coherently detected communications signal 41 as shown in FIG. 4 which when fed through a low pass filter 48, provides an analog output of the audio communications signal generated by the communications signal generator 10 (FIG. 1).

As the input signal-to-noise ratio is reduced, the PRF loop 38 continues to track and demodulate until the loop output RMS noise time jitter exceeds the pulse-width of the video pulses. While a 3 db degradation in the input signal-to-noise ratio occurs when the two quadrature signals are combined in the linear adder 36, this loss is a constant loss; however, it may be eliminated by utilizing a circuit configuration as shown in FIG. 3. This embodiment comprises a double loop detection system whereby the quadrature phase detector implementing the coherent video detection process is replaced by a gated phase lock loop.

Referring now to FIG. 3, the pulse position modulated IF signal is fed to a coherent video detector 26' through a pulse gate 50 or, when desirable, can be bypassed by a switch 52. The gate 50, moreover, is controlled by a gate generator 54 controlled by the split gate generator 42 of the same type as in prf loop 38 as shown in FIG. 2. The coherent video detector 26' includes a phase lock loop 56 which is coupled to the receiver IF output with a multiplier type phase detector 58, the same as the multiplier 28 of FIG. 2 and which operates in quadrature phase with a second multiplier type phase detector 60 which is the same as the signal multiplier 30. The phase lock loop 56 additionally includes a voltage controlled oscillator 62 whose frequency is locked to the frequency of the IF pulses by having its input coupled to the output of the multiplier 58 through a loop filter 63. The output of the voltage controlled oscillator 62 is shifted in phase by 90° in the phase shifter 64 where it is fed to the second multiplier 60 together with the gated IF input from the receiver 24. The output of the multiplier 60 comprises a video detected pulse train which is applied to the input of the time discriminator 40 through a filter 66. Again, the time discriminator 40 provides an output which acts as a video multiplier containing a signal in proportion to the modulation which when filtered by the low pass filter 48, yields a demodulated output communication signal.

Having shown and described what is at present considered to be the preferred embodiments of the invention, it should be noted that the foregoing detailed description has been made by way of illustration and not limitation. Accordingly, all modifications, alterations and changes coming within the spirit and scope of the appended claims is herein meant to be included.

I claim:

1. In a digital pulse position modulation communications system including receiver means responsive to RF signals including a pulse position modulation communication signal transmitted from a communications signal source, coherent signal detector means responsive to IF pulse position modulation communications signals generated by said receiver means comprising:
   quadrature phase type coherent video detector means coupled to said receiver means and being operable to generate envelope detected video pulse position modulated communication signals in response to said IF pulse position modulated communications signals;
   a split gate prf loop, coupled to said coherent video detector means and operating as a coherent signal detector in response to said envelope detected video pulse position modulated communications signals; and
   signal filter means coupled to said prf loop for providing an output comprising said communications signal.

2. The signal detector as defined by claim 1 wherein said communications signal comprises an audio signal and said signal filter means comprises a low pass filter.

3. The signal detector as defined by claim 2 wherein said audio signal comprises a voice signal.

4. The signal detector means of claim 1 wherein said prf loop further comprises:
   a time discriminator, a split gate signal generator, a voltage controlled oscillator, and a loop filter, said time discriminator being coupled to said envelope detected video pulse position modulated communications signals and a split gate signal from said gate generator, said gate generator being controlled by signals from said voltage controlled oscillator which is coupled to said time discriminator by means of said loop filter and wherein the frequency of the signals applied to said gate generator varies in response to the output of said time discriminator, and
   wherein said low pass filter means is connected to the output of said time discriminator.

5. The signal detector means of claim 4 wherein the split gate signal has a pulse width substantially equal to the pulse width of said envelope detected video signals.

6. The signal detector means of claim 5 wherein said quadrature phase type coherent video detector means further comprises:
   first and second dual input phase detectors respectively having one input thereof coupled to said IF signal,
   an IF signal oscillator generating a second IF signal,
   means coupling said second IF signal directly to the other input of said first phase detector,
   90° phase shift means coupling said second IF signal to the other input of said second phase detector, and
   signal adder means coupled to the output of both said phase detectors for providing a composite pulse position modulation video signal pulse train to said time discriminator.

7. The signal detector means of claim 6 where said phase detectors are comprised of signal multipliers.

8. The signal detector means of claim 5 wherein said quadrature phase type coherent video detector means further comprises:
   first and second dual input phase detectors having one input thereof coupled to said IF signal,
   a phase lock loop including a voltage controlled oscillator coupled to the output of said first phase detector and generating a second IF signal, means coupling said second IF signal to the other input of said first phase detector, 90° phase shift means coupling said second IF signal to the other input of said second phase detector, and circuit means coupling a pulse position modulation video signal pulse train from said second phase detector to said time discriminator.

9. The signal detector means of claim 8 and additionally including a loop filter coupled between said first phase detector and said voltage controlled oscillator of said phase lock loop.

10. The signal detector means of claim 8 wherein said coupling circuit means comprises a filter circuit.

11. The signal detector means of claim 8 wherein said first and second phase detectors are comprised of signal multipliers.

12. The signal detector means of claim 8 and additionally including an IF signal gate controlled by said split gate signal generator coupled between said receiver means and said one input of said phase detectors.

13. The signal detector means of claim 11, and additionally including a gate generator coupled to and operating in response to said split gate signal from said split gate generator and being operable to generate a gate control signal which is applied to said IF signal gate.

14. The signal detector means of claim 13 and additionally including signal bypass means coupled to said IF signal gate means for selectively coupling IF signals around said IF signal gate to said coherent video detector means.

* * * * *